United States Patent
Deshpande et al.

(10) Patent No.: US 10,247,770 B2
(45) Date of Patent: Apr. 2, 2019

(54) GATE OXIDE SOFT BREAKDOWN DETECTION CIRCUIT

(71) Applicant: Advanced Micro Devices, Inc., Sunnyvale, CA (US)

(72) Inventors: Abhay Deshpande, Bangalore (IN); Arun S. Iyer, Bangalore (IN); Prasanth K. Vallur, Bangalore (IN); Girish Anathahally Singrigowda, Bangalore (IN); Stephen V. Kosonocky, Ft. Collins, CO (US)

(73) Assignee: Advanced Micro Devices, Inc., Santa Clara, CA (US)

( * ) Notice: Subject to any disclaimer, the term of this patent is extended or adjusted under 35 U.S.C. 154(b) by 278 days.

(21) Appl. No.: 15/381,992

(22) Filed: Dec. 16, 2016

(65) Prior Publication Data

US 2018/0172753 A1 Jun. 21, 2018

(51) Int. Cl.
- *G01R 31/26* (2014.01)
- *H03K 5/159* (2006.01)
- *H03K 3/03* (2006.01)

(52) U.S. Cl.
CPC ......... *G01R 31/2623* (2013.01); *H03K 5/159* (2013.01); *H03K 3/0315* (2013.01)

(58) Field of Classification Search
CPC ............... H03K 5/159; G01R 31/2621; G01R 31/2623; G01R 31/2625; G01R 31/2626; G01R 31/2628; G01R 31/26; G01R 31/2642; G01R 31/2648; G01R 31/2831; G01R 31/31702
USPC ....................................... 324/762.09, 762.01
See application file for complete search history.

(56) References Cited

U.S. PATENT DOCUMENTS

| | | | |
|---|---|---|---|
| 6,188,234 B1 * | 2/2001 | Abadeer | G01R 31/129 257/48 |
| 7,271,608 B1 * | 9/2007 | Vermeire | G01R 31/2856 324/750.3 |
| 2013/0015876 A1 * | 1/2013 | Lai | G01R 31/31924 324/762.01 |

OTHER PUBLICATIONS

Tae-Hyoung Kim, et al., Silicon Odometer: An On-Chip Reliability Monitor for Measuring Frequency Degradation of Digital Circuits, 43 IEEE J. Solid-State Circuits 874 (Apr. 2008) (Year: 2008).*

Depas, M. et al., "Soft Breakdown of Ultra-Thin Gate Oxide Layers," IEEE Transactions on Electron Devices, vol. 43, No. 9, Sep. 1996, pp. 1499-1504.

Degraeve et al., "Refined BD position determination," Purdue University, ECE695: Reliability Physics of Nano-Transistors Lecture 28: Circuit Implications of Dielectric Breakdown, IRPS, 2001, p. 360.

(Continued)

*Primary Examiner* — Tung X Nguyen
*Assistant Examiner* — Robert P Alejnikov, Jr.
(74) *Attorney, Agent, or Firm* — Zagorin Cave LLP (57) ABSTRACT

Various embodiments of a gate oxide breakdown detection technique detect gate oxide degradation due to stress on a per part basis without destroying functional circuits for an intended application. Stress on the gate oxide may be applied while nominal drain currents flow through a device, thereby stressing the device under conditions similar to actual operating conditions. The technique is relatively fast and does not require analog amplifiers or tuning of substantial amounts of other additional circuitry as compared to conventional gate oxide breakdown detection techniques.

20 Claims, 7 Drawing Sheets

(56) References Cited

OTHER PUBLICATIONS

Karl, E. et al., "Compact In-Situ Sensors for Monitoring Negative-Bias-Temperature-Instability Effect and Oxide Degradation," IEEE International Solid-State Circuits Conference, Session 22, 2008, 3 pages.
Nishioka, Y. et al., "Gate-Oxide Breakdown Accelerated by Large Drain Current in n-Channel MOSFET's," IEEE Electron Device Letters, vol. 12, No. 3, Mar. 1991, pp. 134-136.
Roussel, P. et al., "Accurate Reliability Evaluation of Non-Uniform Ultrathin Oxynitride and High-k Layers," IEEE 41st Annual International Realability Physics Symposium, 2003, pp. 29-33.
Sahhaf, S. et al., "A New TDDB Reliability Prediction Methodology Accounting for Multiple SBD and Wear Out," IEEE Transactions on Electron Devices, vol. 56, No. 7, Jul. 2009, pp. 1424-1432.
Weir, B.E. et al., "Low Voltage Gate Dielectric Reliability," Semiconductor Science and Technololgy 15, 2000, p. 455.

\* cited by examiner

GATE OXIDE SOFT BREAKDOWN DETECTION CIRCUIT

BACKGROUND

Field of the Invention

The present invention is related to integrated circuits and more particularly to failures in integrated circuits.

Description of the Related Art

In general, the gate oxide of a transistor is subjected to extreme stress during operation, e.g., stresses due to high overshoots and undershoots of a signal applied to the gate of the transistor or stresses due to power supply over-voltages used to boost the performance of the transistor and associated system. As semiconductor manufacturing technology shrinks transistor dimensions, the gate oxide thickness also decreases, causing higher electric fields to be observed by the gate oxide. Those higher electric fields stress gate oxide structures and cause failures of the transistors in time over continuous operation. Therefore, it is desirable to evaluate the failure rates of transistors due to gate oxide degradation in response to high dielectric stresses. Time Dependent Dielectric Breakdown (TDDB) is a conventional methodology that assumes that upon a breakdown of the gate oxide, the transistor undergoes catastrophic breakage and no longer functions. This assumption causes an amount of pessimism in the device reliability calculations and predictions based on that methodology. Accordingly, improved techniques for determining device reliability are desired.

SUMMARY OF EMBODIMENTS OF THE INVENTION

In at least one embodiment, an apparatus for detecting a breakdown of gate oxide of a transistor includes a first instance of a device responsive to a first node. The first instance of the device is configured to be stressed in a first mode of the apparatus and to be unstressed in a second mode of the apparatus. The apparatus includes a second instance of the device responsive to a second node, a power control circuit configured to couple a first high voltage reference input of the first instance of the device to a first power supply node in the first mode of the apparatus and to couple the first high voltage reference input of the first instance of the device to a second power supply node in the second mode of the apparatus. The apparatus includes a precharge circuit configured to selectively precharge the first node and the second node in response to a precharge control signal in the second mode of the apparatus. The apparatus includes a voltage difference detection circuit configured to generate a gate oxide breakdown detection signal in response to a voltage difference across the first node and the second node in the second mode of the apparatus, after precharging the first node and the second node.

The apparatus may include a test circuit configured to stress the first instance of the device in the first mode of the apparatus. The test circuit may include a delay line including the first instance of the device. In the first mode of the apparatus, the delay line may be configured to continuously switch a first signal on the first node of the first instance of the device between a high signal level and a low signal level and to develop a drain current in at least one transistor under stress of the first instance of the device. The test circuit may include additional instances of the device coupled in parallel with the first instance of the device.

The first power supply node may provide a first high reference voltage level greater than a manufacturer-specified upper voltage level limit and the second power supply node provides a ground reference voltage level. The precharge circuit may be coupled to a third power supply node configured to provide a second high reference voltage level. The second high reference voltage level may be greater than the ground reference voltage level provided by the second power supply node and less than or equal to the manufacturer-specified upper voltage level limit.

The apparatus may include a functional circuit configured to receive a first high reference voltage signal, a voltage source configured to provide a predetermined voltage offset, a circuit configured to provide a second high reference voltage signal to the first power supply node based on the first high reference voltage signal and the predetermined voltage offset, and a monitor circuit comprising a test circuit configured to stress the first instance of the device in the first mode of the apparatus, the second instance of the device, the precharge circuit, the power control circuit, and the voltage difference detection circuit. The monitor circuit may be configured to generate the gate oxide breakdown detection signal using the second high reference voltage signal, the first high reference voltage signal, and a low reference voltage signal. The monitor circuit may detect gate oxide breakdown of the first instance of the device prior to gate oxide breakdown of any device of the functional integrated circuit.

In at least one embodiment, a method for detecting breakdown of gate oxide of a transistor includes applying electrical stress to a first instance of a device including at least one transistor coupled to a first node. The method includes maintaining, in an unstressed state, a second instance of the device coupled to a second node, removing the electrical stress from the first instance of the device, precharging the first node and the second node after removing the electrical stress, and after precharging the first node and the second node, generating a gate oxide breakdown detection signal based on a sensed voltage difference across the first node and the second node. Applying electrical stress may include applying an oscillating signal to an input of the first instance of the device and applying a voltage level greater than a manufacturer-specified upper voltage level limit to a first power supply node of the first instance of the device, thereby developing a drain current in at least one transistor of the first instance of the device. The method may include accelerating gate oxide breakdown of the first instance of the device as compared to gate oxide breakdown of another device in a functional circuit of an integrated circuit die. The gate oxide breakdown of the device may be detected prior to a breakdown of gate oxide of any device of the functional circuit.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Before a transistor undergoes a catastrophic breakdown (i.e., a hard breakdown that renders the transistor nonfunctional), a soft breakdown of the gate oxide may occur. Upon a soft breakdown, the transistor continues to function as a transistor, but has higher gate leakage currents. Those gate leakage currents may be orders of magnitude greater than gate leakage currents of a normal or unstressed transistor that has not experiences soft breakdown. By detecting the onset of soft breakdown, the capability of the gate oxide to handle the stresses due to over/under voltages on a per part basis may be determined. Detection of the onset of soft breakdown may also enable the update of reliability parameters for a time-dependent gate oxide breakdown methodology with larger samples of gate oxide breakdown detection.

A conventional technique for detecting breakdown of the gate oxide uses Scanning Electron Microscope (SEM) images of a manufactured integrated circuit. This technique for detecting breakdown is cost-intensive and destructive to the integrated circuit. Another technique for detecting gate oxide breakdown includes antenna gate area test with FN tunneling caused at the gate of a transistor under accelerated stress on the gate using constant current sources. That technique requires a precise off-chip test and measurement setup, and is destructive to the integrated circuit.

Figure 1:
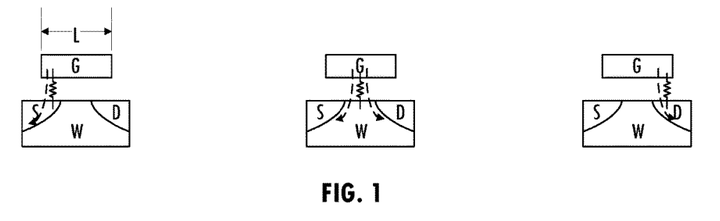
FIG. 1 illustrates gate leakage current paths after a soft breakdown of gate oxide of a metal-oxide-semiconductor field-effect transistor (MOSFET) transistor.

A nondestructive and relatively inexpensive technique for detecting breakdown of gate oxide in an integrated circuit includes using a circuit that detects the occurrence of a breakdown of the gate oxide during regular operation of the integrated circuit. The onset of gate oxide breakdown in a device may be detected based on properties unique to the device operation or the physical characteristics of the gate oxide, e.g., high gate leakage currents. Referring to FIG. 1, gate leakage current increases substantially from a negligible level through a gate-to-source path, gate-to-substrate path, or gate-to-drain path. Gate oxide breakdown may be accelerated for devices that sustain an over-voltage or an under-voltage while also conducting drain currents. By applying voltage stress to devices conducting drain currents, gate oxide breakdown may be detected based on higher gate leakage currents at the gates of those devices.

Figure 2:
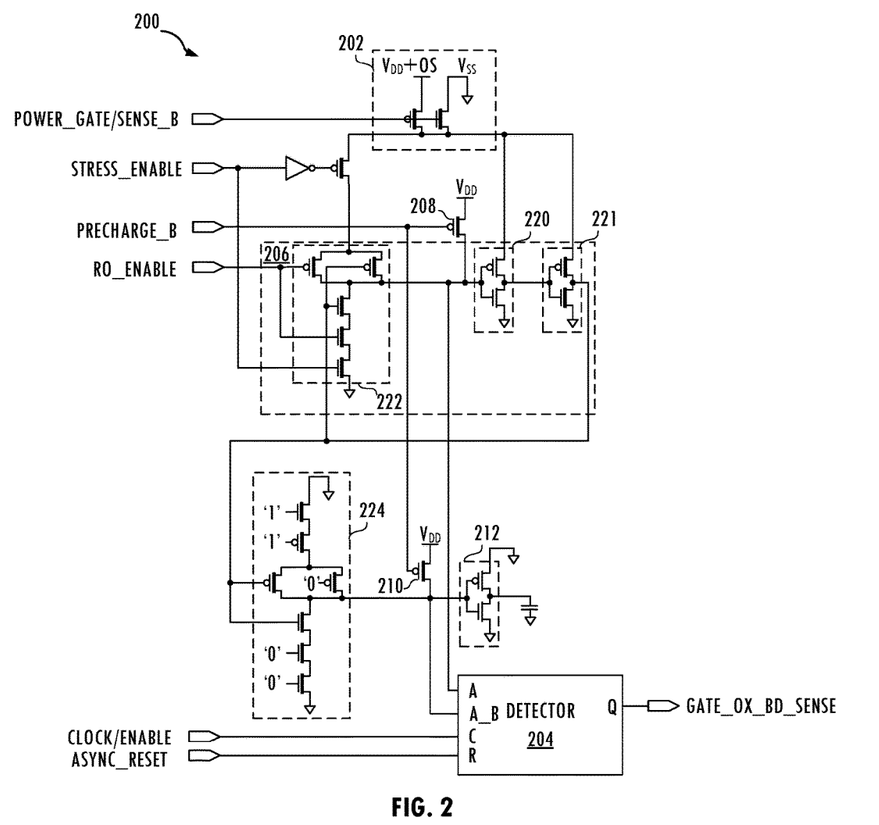
FIG. 2 illustrates a circuit diagram of a gate oxide breakdown detection circuit consistent with at least one embodiment of the invention.

Referring to FIG. 2, gate oxide breakdown detection circuit 200 is configured to selectively apply a predefined stress to a device and to detect whether a gate oxide breakdown occurs in response to that predefined stress. Device 220 is an instance of a device (e.g., an inverter circuit) that is the device under test within a functional circuit or test circuit (e.g., delay chain 206). As referred to herein, an instance of a device is a replica of that device and all instances of the device have the same designed properties (e.g., threshold voltage, width, length, or other suitable properties) and any variations in those designed properties are related to manufacturing. Delay chain 206 may be configured as a ring oscillator circuit for operation at a free running frequency. Delay chain 206 may also be configured as part of functional logic with switching activity under normal activity factors and operating frequency. Device 212 is another instance of the same device (e.g., another instance of the inverter) as the device under test. Device 212 is configured as an unstressed reference device, but is otherwise a replica of device 220. For example, device 212 is an inverter circuit including the same number and type of transistors as in device 220 and the transistors in device 212 have the same threshold voltages and sizes as the transistors in device 220. In addition, replica driving device 224, which is a simplified version of device 222, but driven with soft high voltage levels (corresponding to a logic '1') and soft low voltage levels (corresponding to a logic '0'), is configured to drive device 212, similarly to the effect of device 222 on device 220. Device 222 and replica driving device 224 provide devices 220 and device 212, respectively, with similar leakage paths. However, device 212 is configured for little or no stress on its transistors, e.g., the transistors of device 212 are not provided an over-voltage level power supply signal, but rather receive a power supply voltage level within manufacturer specifications. Thus, the effects of aging on these devices will be negligible. Note that the inverter circuit of device 220 and of device 212 is exemplary only and instances of other devices may be used (e.g., other logic circuit or other circuit configuration of one or more transistors).

Power control circuit 202 is responsive to the POWER_GATE/SENSE_B signal to selectively couple device 220, device 221, and device 222 of delay chain 206 directly or indirectly to a low power supply node or a high power supply node that provides a power supply voltage level that exceeds manufacturer specifications. Gate oxide breakdown detection circuit 200 selectively operates in a stress application mode and in a sensing mode in response to one or more control signal. For example, when the POWER_GATE/SENSE_B signal has a low level (i.e., has a digital value of '0'), power gating is inactive and gate oxide breakdown detection circuit 200 is configured in a stress application mode that causes gate oxide breakdown detection circuit 200 to apply a high power supply voltage to device 220. The high power supply voltage node receives an over-voltage level $V_{DD}$+OS that exceeds high power supply voltage level $V_{DD}$, which may be the maximum power supply level specification for the target manufacturing process. In addition, the POWER_GATE/SENSE_B, STRESS_ENABLE and RO_ENABLE signals configure device 220, the device under test, as part of a delay chain 206 in a ring oscillator circuit or as a functional portion of another circuit having high frequency switching activity. Thus, the configuration of the stress application mode stresses the transistors within device 220 using the voltage applied to high power supply voltage nodes while transistors in device 220 conduct drain currents due to the high frequency switching activity. In the stress application mode, the CLOCK/ENABLE and PRECHARGE_B signals disable detector 204 and the precharge circuit formed by precharge transistors 208 and 210, respectively, thereby causing precharge transistors 208 and 210 to be in a cut-off mode of operation.

When power gating is inactive (e.g., the POWER_GATE/SENSE_B signal has a low level, e.g., has a digital value of '0'), gate oxide breakdown detection circuit 200 is configured in a sensing mode of operation and power control circuit 202 couples device 220, device 221, and device 222 to a lower power supply node (e.g., ground or $V_{SS}$) directly or indirectly. The STRESS_ENABLE signal provides tri-state control of device 222 (e.g., AND gate) to disable undesirable discharge paths coupled to the input node of device 220 in the sensing mode. Thus, device 220 is configured in an unstressed state. Note that, in contrast to conventional power gating circuits, power control circuit 202 does not leave power supply nodes floating during the sensing mode of operation, but rather drives them to a ground voltage level.

Detector 204 may be a sense amplifier or other suitable circuit that compares two signal levels and generates an indicator thereof. Detector 204 includes a non-inverting input terminal that is coupled to the input node of device 220. Detector 204 includes an inverting input terminal that is coupled to the input node of device 212. Detector 204 may be reset using the ASYNC_RESET signal to eliminate any undesired initial condition at the output of detector 204. e.g., which may occur during repeated measurements. In at least one embodiment of gate oxide breakdown detection circuit 200, device 220 and device 212 are separate instances of a conventional CMOS inverter but other device types may be used. Each instance of the CMOS inverter has an input node that is coupled to a gate terminal of a p-type device and a gate terminal of an n-type device. Note that detector 204 may have other configurations in a gate oxide breakdown detection circuit consistent with the teachings herein. For example, in other embodiments, the input node of device 220 is coupled to the inverting input of detector 204 and the input node of device 212 is connected to the non-inverting input of detector 204. In at least one embodiment, detector 204 is formed using thick oxide transistors (i.e., transistors having higher breakdown voltages than conventional transistors for a particular manufacturing process) that can safely sustain any overshoots and undershoots of voltage levels or other high voltage levels caused by electrical stress that is applied to device 220. To ensure that device 220 undergoes gate oxide breakdown before other devices in delay chain 206, device 222, device 221, power control circuit 202, precharge transistor 208, precharge transistor 210, and replica driving device 224 may also be formed from thick oxide transistors, as indicated by the thicker gates in the transistor symbols of FIG. 2.

In at least one embodiment, gate oxide breakdown detection circuit 200 is in the sensing mode in response to the POWER_GATE/SENSE_B signal having a high level (i.e., has a digital value of '1') and gate oxide breakdown detection circuit 200 is configured to remove the stresses applied to device 220. For example, when the POWER_GATE/SENSE_B signal is high, the n-type transistors in power control circuit 202 are in saturation thereby directly or indirectly providing a strong connection between the low power supply node and source and bulk terminals of any p-type transistors in device 220, device 221, or device 222. Meanwhile, the PRECHARGE_B signal receives a low signal, enabling precharge transistors 208 and 210 to pre-charge to the same voltage levels (e.g., to VDD, which may be a less than or equal to a maximum power supply voltage level specified by the semiconductor manufacturer), the gates and parasitic capacitors of transistors in device 220 and the unstressed transistors in device 212.

While still in the sensing mode, but after application of the precharge for a predetermined amount of time, the PRECHARGE_B signal receives a high signal, which disables precharge transistors 208 and 210. When the precharge is disabled (and the POWER_GATE/SENSE_B signal has a high level), the gate capacitances and the parasitic capacitances of device 220 and device 212 begin to discharge through any parasitic resistances. If a soft breakdown has occurred at the gate oxides of transistors in device 220, a comparatively lower resistance path will exist in device 220 from one or more gate terminals to a drain, source, or bulk of an associated transistor. Soft breakdown will manifest itself as a faster discharge rate of one or more of the gate capacitances as compared to a discharge rate of gate capacitances of the reference unstressed transistors in device 212. The CLOCK/ENABLE signal has a predetermined pulse width that will cause detector 204 to sense any differential voltage build up and change a state of the output signal on GATE_PX_BD_SENSE output terminal. The predetermined pulse width of the CLOCK/ENABLE signal may be determined based on the pre-charge signal or by other suitable technique. If no breakdown has occurred, any voltage differential build up will not be sufficient to change the output of a sense amplifier latch or other sensing circuit used in detector 204. Accordingly, at the end of the pulse of the CLOCK/ENABLE signal, the signal on the GATE_OX_BD_SENSE terminal provides a reliability indicator, e.g., a digital indication of whether a gate oxide breakdown occurred in device 220.

Figure 3:
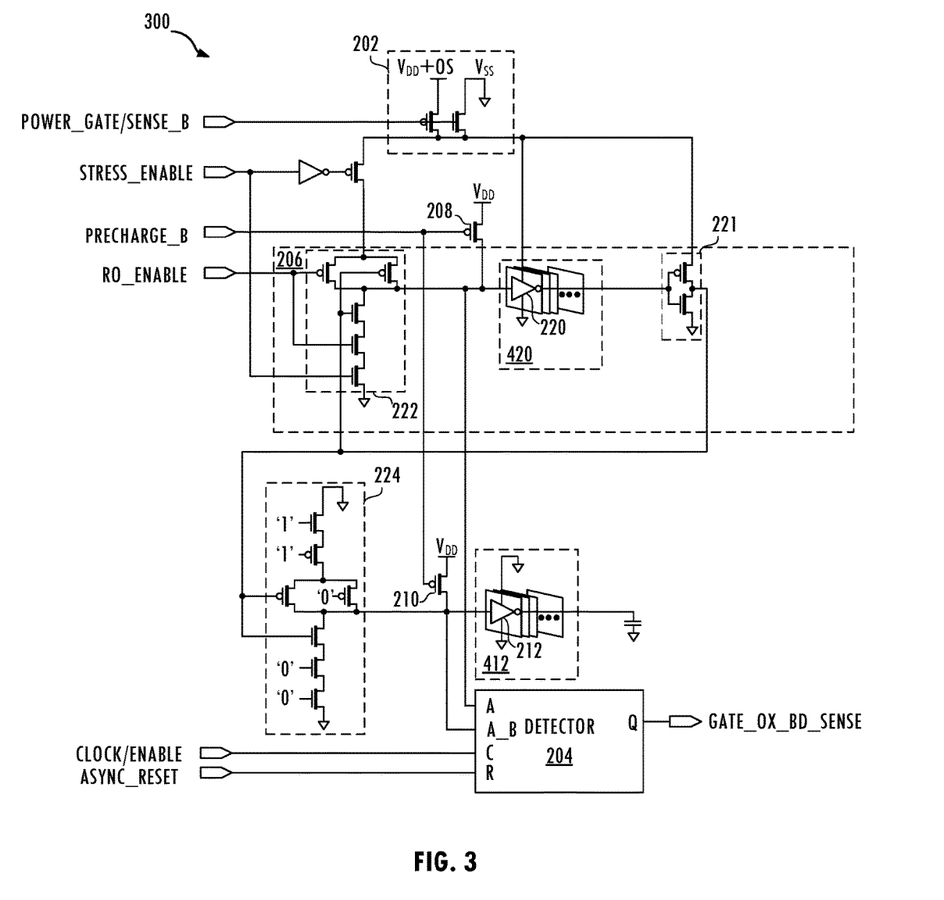
FIG. 3 illustrates a circuit diagram of a gate oxide breakdown detection circuit detecting breakdown using a parallel array of devices under test consistent with at least one embodiment of the invention.

In general, typical integrated circuit transistors do not experience gate oxide breakdown at the same time. Rather, failure due to gate oxide breakdown in an integrated circuit may be represented by a statistical probability of failure with an increased number of devices under test increasing the likelihood of failure under particular conditions. Since gate oxide in an integrated circuit is characterized by a statistical probability of breaking down, increasing the area of gate oxide tested increases the likelihood of detecting breakdown under particular conditions. Referring to FIG. 3, in at least one embodiment, gate oxide breakdown detection circuit 300 increases the area of the gate oxide being tested by using device array 420 as the device under test. Device array 420 includes an array of N instances of inverter 220 coupled in parallel to increase the area of the gate oxide being tested for breakdown. Device array 412 forms an unstressed reference device from another array of N instances of inverter 212 coupled in parallel. Gate oxide breakdown detection circuit 300 is configured to operate in a stress application mode (e.g., using delay chain 206 and power control circuit 202) and a sensing mode similarly to the operation of gate oxide breakdown detection circuit 200 described above, but with increased likelihood of detecting breakdown under particular conditions.

Figure 4:
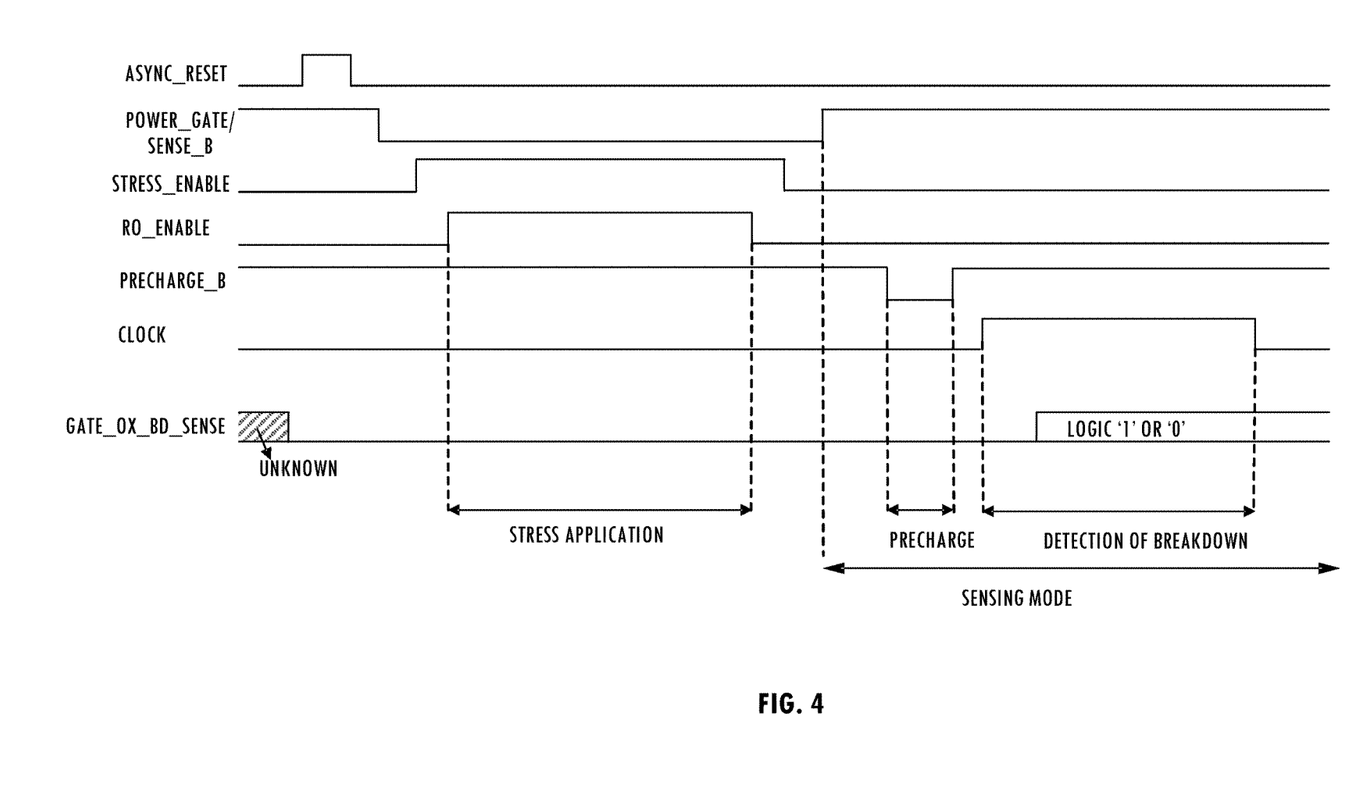
FIG. 4 illustrates exemplary timing waveforms for signals of the gate oxide breakdown detection circuit of FIGS. 2 and 3 consistent with at least some embodiments of the invention.

FIG. 4 illustrates timing waveforms for implementing an exemplary testing technique using gate oxide breakdown detection circuit 200 of FIG. 2 or gate oxide breakdown detection circuit 300 of FIG. 3. The ASYNC_RESET signal asynchronously clears an unknown value on the output of detector 204. After reset, the POWER_GATE/SENSE_B signal transitions low to couple device 220 and device 221 of delay chain 206 to the high power supply node. The STRESS_ENABLE signal the transitions high to provide power to device 222 and the RO_ENABLE signal transitions high to enable delay line 206, which is configured as a ring oscillator. While stress is applied to device 220, device 212 remains unstressed. After completion of stress application (e.g., the POWER_GATE/SENSE_B signal transitions high, the STRESS_ENABLE signal transitions low, and the RO_ENABLE signal transitions low), the gate oxide breakdown detection circuit enters the sensing mode. PRECHARGE_B signal transitions low, causing precharge transistor 208 and precharge transistor 210 to precharge to a high voltage level the input nodes of device 220 and device 212, respectively. After precharging of those input nodes is completed and precharge transistor 208 and precharge transistor 210 are disabled, the CLOCK signal enables detector 204 to detect whether gate oxide breakdown has occurred. Detector 204 drives a logic '1' on the GATE_OX_BD_SENSE output terminal to indicate detection of gate oxide breakdown. Otherwise, detector 204 drives a logic '0' on the GATE_OX_BD_SENSE output terminal. Note that the waveforms of FIG. 4 are exemplary only and other signal levels may be used to stress an instance of a device and sense gate oxide breakdown based on leakage currents of the stressed instance of the device and an unstressed instance of the device consistent with the teachings herein.

Figure 5:
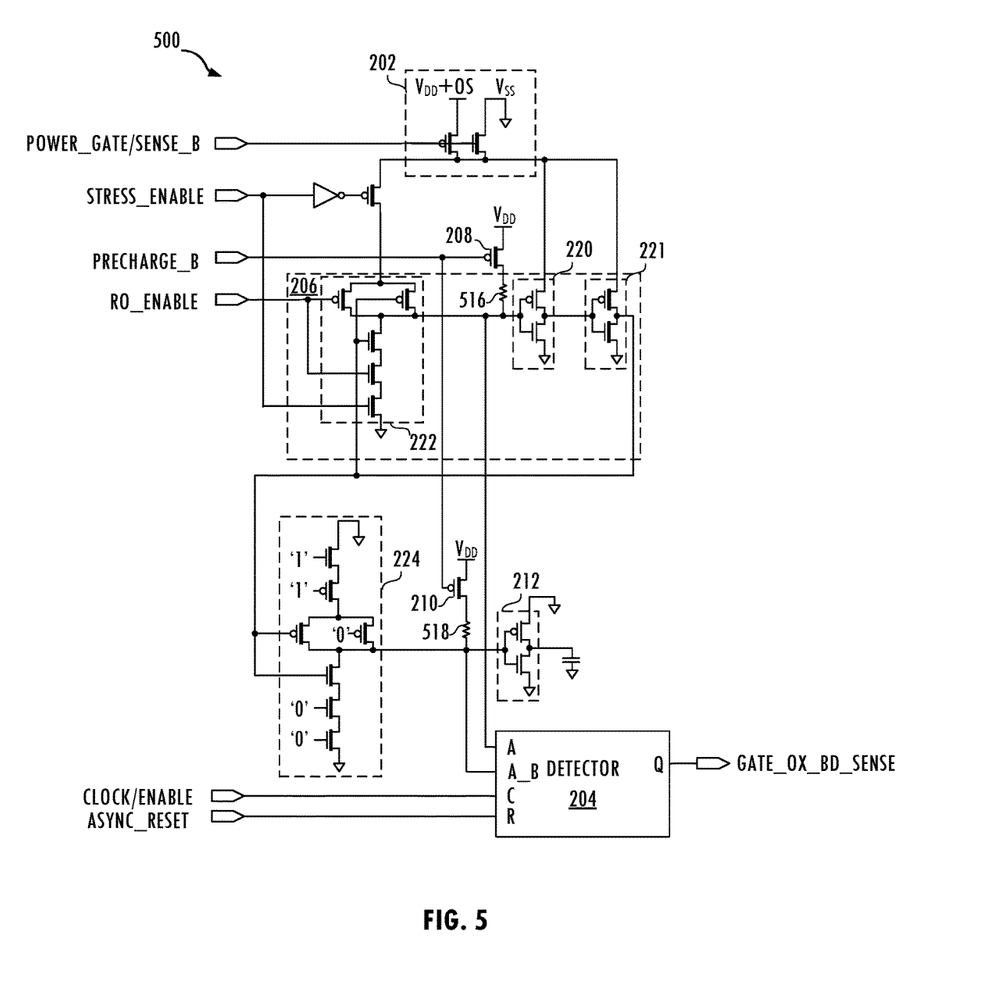
FIG. 5 illustrates a circuit diagram of a gate oxide breakdown detection circuit including weak p-type keepers in the precharge circuits consistent with at least one embodiment of the invention.

FIG. 5 illustrates a gate oxide breakdown detection circuit having increasingly robust detection of gate oxide breakdown based on leakage current. The precharge circuitry of gate oxide breakdown detection circuit 500 includes weak p-type keepers with large resistances (e.g., approximately 100 kΩ) instead of p-type transistors, alone as illustrated in FIGS. 2 and 3. The precharge circuit includes a weak p-type keeper with a large resistance for unstressed reference device 212. In addition, detector 204 is formed from thick oxide transistors in order to prevent devices in detector 204 from undergoing gate oxide breakdown.

Gate oxide breakdown detection circuit 500 operates in stress application mode and sensing mode, consistent with the above description. The stress application mode of gate oxide breakdown detection circuit 500, which includes ring oscillator 206 and power control circuit 202, operates similarly to the gate oxide breakdown detection circuits described above. However, gate capacitances of gate oxide breakdown detection circuit 500 are not left floating like in other embodiments of a gate oxide breakdown detection circuit. The gate capacitance of device 220 of FIG. 5 is driven by a weak p-type driver through resistor 516 having a high resistance. If a soft breakdown has resulted due to stresses on a gate of device 220, the leakage gate currents will cause a reduction in potential at gate input of device 220. That reduction in potential will not be present at the gate of reference device 212, which is driven by a weak p-type driver through resistor 518 having a high resistance, and the input gate resistances will be very high. This difference in the potentials at the input nodes of device 220 and reference device 212 may be detected by detector 204, which may include a sense amplifier based latch.

Figure 6:
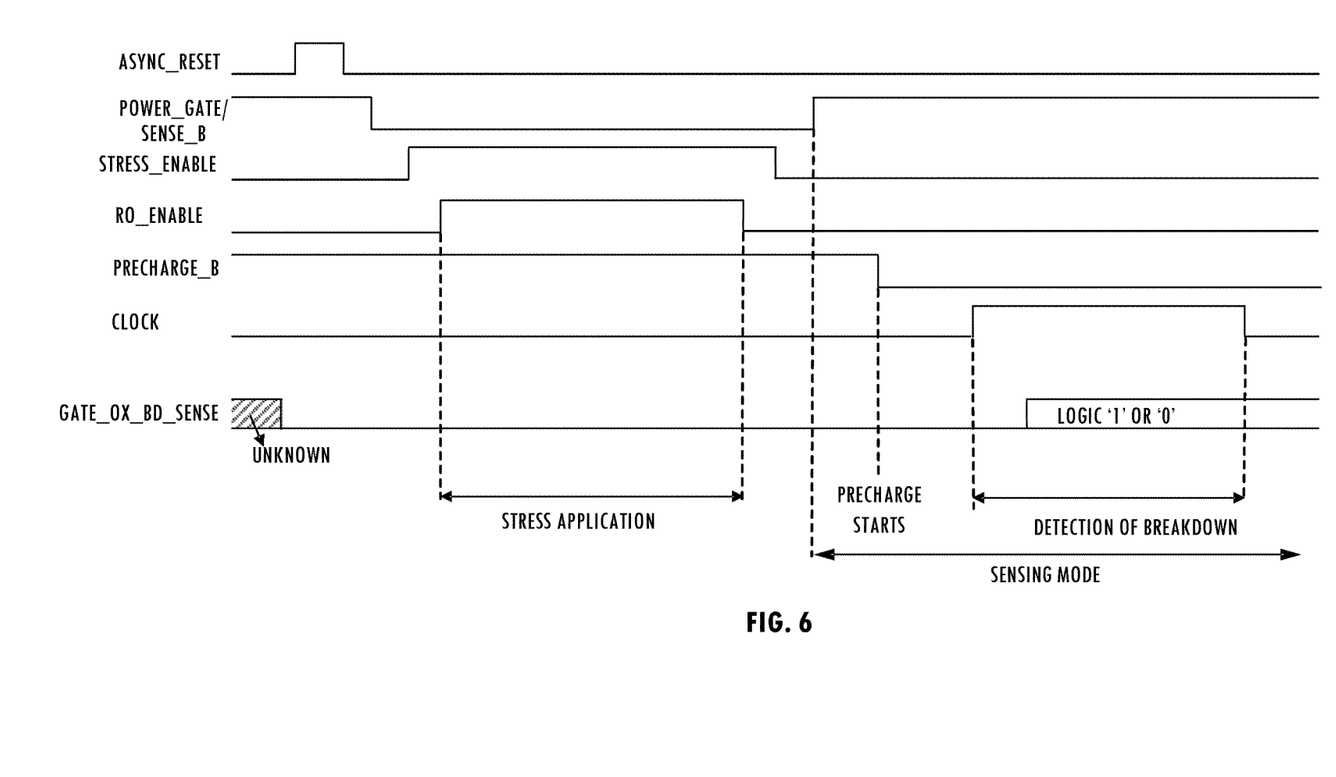
FIG. 6 illustrates exemplary timing waveforms for signals of the gate oxide breakdown detection circuit of FIG. 5 consistent with at least one embodiment of the invention.

FIG. 6 illustrates timing waveforms for implementing an exemplary testing technique using gate oxide breakdown detection circuit 500. The exemplary testing technique is similar to the technique illustrated in FIG. 4 for gate oxide breakdown detection circuit 200 and gate oxide breakdown detection circuit 300. However, after the RO_ENABLE signal and the STRESS_ENABLE signal each transition to a low level and the POWER_GATE/SENSE_B signal transitions to a high level, the PRECHARGE_B signal receives a low level that initiates precharging to configure precharge transistor 208 and precharge transistor 210 as weak p-type keepers on the input nodes of device 220 and device 212, respectively. Charge delivery continues during the sensing mode. After precharging of those input nodes for a predetermined amount of time, the CLOCK signal enables detector 204 to detect whether gate oxide breakdown has occurred. Note that the waveforms are exemplary only and other signal levels may be used to apply stress, precharge, and detect breakdown using variations of circuit 500 resulting in different logic levels of the control signals that trigger behavior consistent with stress application, precharge, and breakdown detection functions in those variations of circuit 500.

In other embodiments of the gate oxide breakdown detection circuits of FIGS. 2, 3, and 5, the delay line configured as a ring oscillator may include additional devices 220 and 221 (e.g., greater than ten devices) and additional power control circuits 202, but with alternate devices of the ring oscillator being configured as devices-under-test. The increase in devices under test allows testing of multiple instances of the device within a single ring oscillator rather than using multiple instances of the entire test circuit. The replica circuit including device 224, device 210, and device 212 or device 412 can be replaced by a full ring oscillator structure including delay chain 206 and power control circuit 202, but coupled to $V_{DD}$ instead of the elevated power supply of $V_{DD}$+OS.

Note that gate oxide breakdown detection circuits of FIGS. 2-5 may detect hard breakdown and soft breakdown of gate oxide and a gate oxide breakdown detection circuit may include additional circuitry to distinguish the type of breakdown detected. Accordingly, the gate oxide breakdown detection circuit may include circuitry that determines whether a failing transistor is still functional. For example, a gate oxide breakdown circuit may detect whether a ring oscillator including the device under test continues to generate an oscillating output signal after detecting a gate oxide breakdown of the device under test and generate an indication of whether the breakdown is a hard or soft breakdown based on the results. Other functional tests may be implemented in circuitry to distinguish whether the gate oxide of the device under test has experienced a hard breakdown or a soft breakdown.

Figure 7:
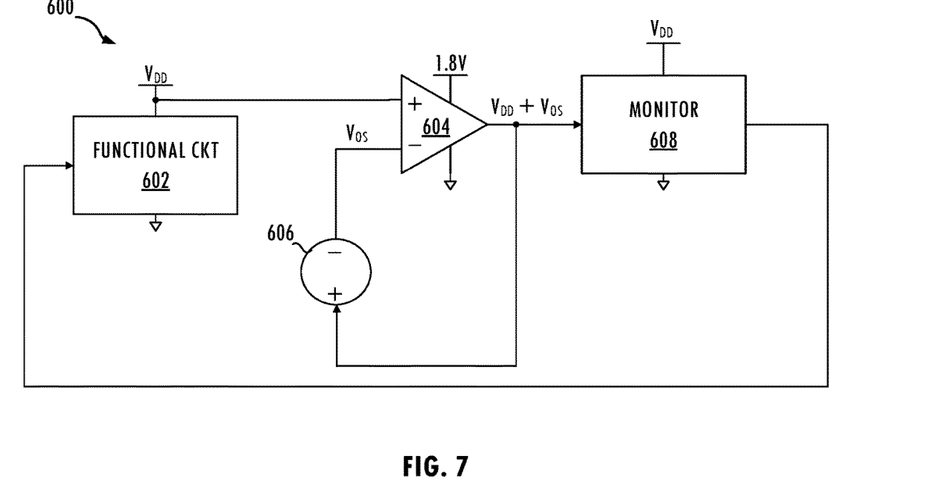
FIG. 7 illustrates a functional block diagram of a gate oxide breakdown detection system consistent with at least one embodiment of the invention.

Referring to FIG. 7, system 600 exercises monitor 608 to detect gate oxide breakdown in an instance of a device of monitor 608 prior to any gate oxide breakdown in functional circuit 602. Functional circuit 602 may be a central processing unit, graphic processing unit, system-on-a-chip, or other functional circuitry for a target application. System 600 provides a high power supply voltage $V_{DD}$, which may be provided from an external power supply, to functional circuit 602. Functional circuit 602 may include a power management unit that regulates a high voltage level based on high power supply voltage $V_{DD}$ according to application performance requirements. The actual voltage level of high power supply voltage $V_{DD}$ has a target voltage level within a particular range of voltage levels (i.e., between a minimum voltage level and a maximum voltage level), and at any instance of time, high power supply voltage $V_{DD}$ may depend on actual usage. In addition, note that high power supply voltage $V_{DD}$ may vary from a target voltage level due to noise on a power supply line or unintentional over voltage or under voltage.

Figure 8:
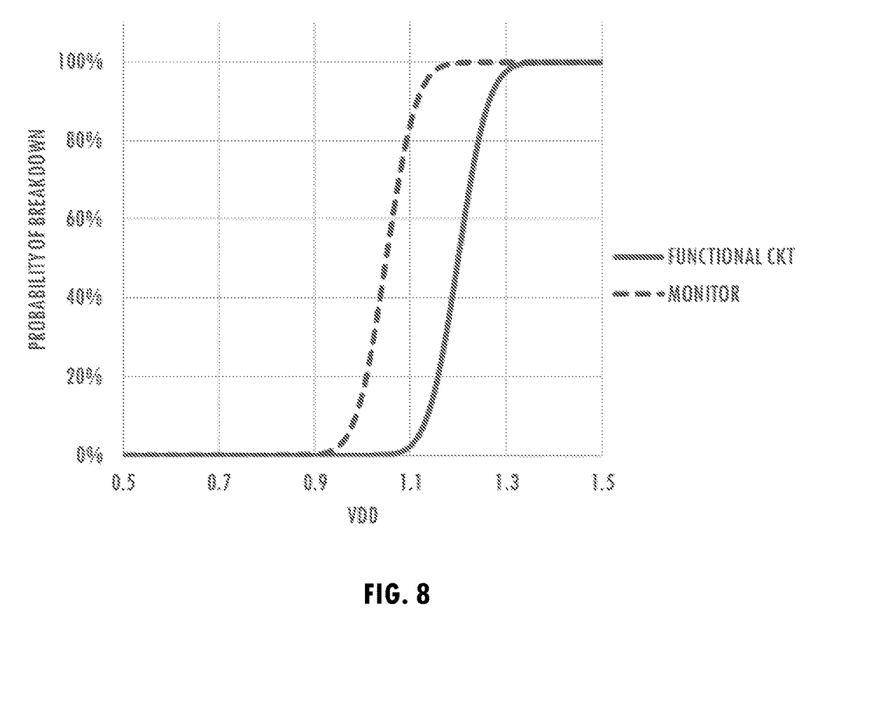
FIG. 8 illustrates the effect of monitor stress upon a probability of gate oxide breakdown consistent with at least one embodiment of the invention.

Monitor 608 includes at least one embodiment of the gate oxide breakdown detection circuits described above and a control signal generator that generates the associated control signals received by that gate oxide breakdown detection circuit. Monitor 608 is responsive to an external high power supply voltage level generated based on combination of high power supply voltage $V_{DD}$ and offset voltage level $V_{OS}$ provided by power supply 606. The combined voltage reference may be generated by operational amplifier 604 or other suitable circuitry for combining high power supply voltage $V_{DD}$ and offset voltage level $V_{OS}$. That combined voltage reference effectively provides a guard band that accelerates aging of a device under test in monitor 608 as compared to devices in functional circuit 602 and shifts the cumulative distribution function that describes the probability of gate oxide breakdown as a function of high power supply voltage $V_{DD}$ (e.g., a probability having a Gaussian distribution) to lower levels of high power supply voltage $V_{DD}$, as illustrated in FIG. 8. Thus, unlike conventional monitor solutions that track the actual power supply voltage provided to functional circuitry and may experience gate oxide breakdown in functional circuitry prior to gate oxide breakdown detection by the conventional monitor, monitor 608 of system 600 experiences gate oxide failure prior to any gate oxide breakdown of functional circuit 602.

Figure 9:
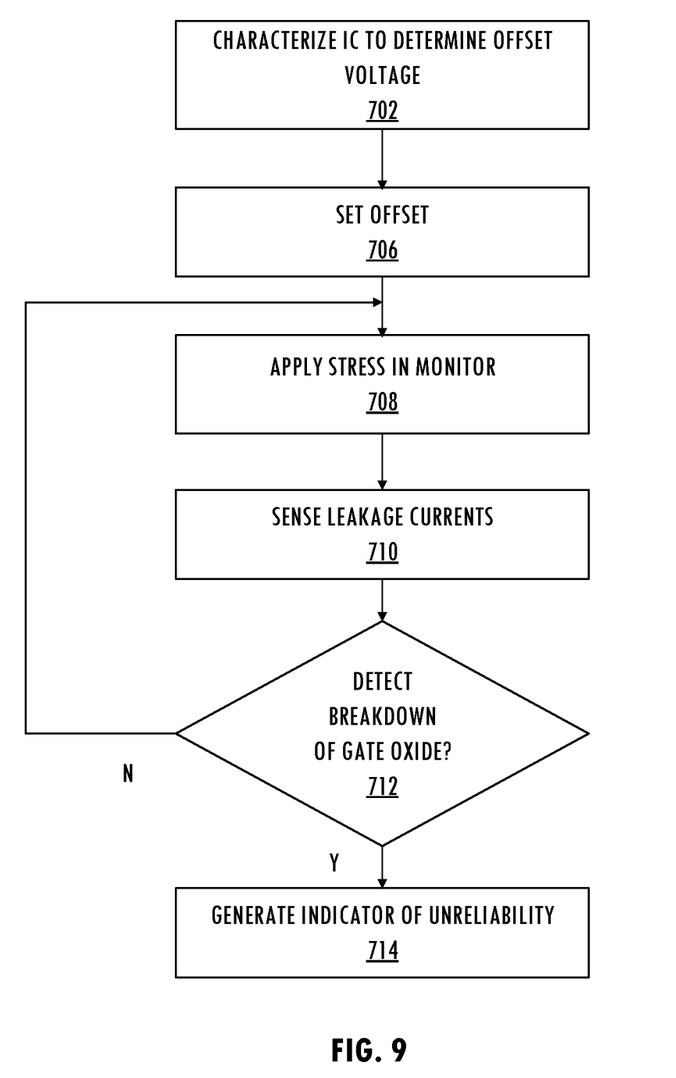
FIG. 9 illustrates exemplary information and control flows for the gate oxide breakdown detection system of FIG. 7 consistent with at least one embodiment of the invention.

The offset voltage $V_{OS}$ provided by power supply 606 may be predetermined based on characterization of the integrated circuit (702). Offset voltage $V_{OS}$ determines the maximum operating voltage supplied to functional circuit 602 accounting for worst-case effects (e.g., based on measurements, observation, analysis, and any uncertainty in modeling). Factors that may affect the maximum operating voltage include any boost mode voltage based on frequency targets, voltage noise due to change in current over time events, and signal integrity issues. Offset voltage $V_{OS}$ may be a function of any boost mode voltage, peak power supply noise, signal voltage overshoot, modeling uncertainty. The maximum operating voltage may equal the nominal voltage plus the offset voltage. The predetermined value may be used to program a level of output for power supply 606 (706). Referring to FIGS. 7 and 9, the offset voltage $V_{OS}$ may be selected to have a value that causes failure of the monitor device under test at a power supply voltage level that is approximately three standard deviations lower voltage than gate oxide breakdown voltage level associated with the functional circuit (e.g., GPU, CPU, or system-on-a chip) being monitored (706). For example, a mean breakdown voltage is 1.2 V and follows a normal distribution with one standard deviation equal to 0.05V. Thus, if the offset voltage $V_{OS}$ is set to a level that is three standard deviations lower voltage than 1.2 V, the monitor circuit will fail prior to failure of the functional circuit, e.g., at a mean power supply voltage $V_{DD}$ of approximately 1.05 V. Monitor 608 applies stress to the device under test during production test, or during operation of system 600 in an intended application (708). After removing the stress, monitor 608 enters the sensing mode to sense leakage currents of the device under test and an unstressed instance of the device (710). If monitor 608 does not detect breakdown of gate oxide of the device under test (712), monitor 608 continues to apply stress (708) and sense leakage currents (710). If monitor 608 does detect a breakdown of gate oxide of the device under test, monitor 608 generates an indication of unreliability (714).

The output of monitor 608, which may indicate that a predetermined percentage of transistors would be damaged, may be fed back to the functional circuitry, e.g., to cause functional circuitry to enter a safe mode or decreased performance mode, or to cause functional circuitry to provide an indication of unreliability. System 600 may also be used in production test or during product characterization to predict when the functional circuitry will fail by varying combined voltage level $V_{DD}+V_{OS}$ provided to monitor 608.

Thus, various embodiments of a gate oxide breakdown detection technique that detects gate oxide degradation due to stress on a per part basis without destroying functional circuits for an intended application have been described. Stress on the gate oxide of a transistor may be applied when nominal drain currents will be flowing through the transistors, thereby stressing a device closer to actual operating conditions. The technique is fast and does not require analog amplifiers or tuning of substantial amounts of other additional circuitry as compared to conventional gate oxide breakdown detection techniques.

While circuits and physical structures have been generally presumed in describing embodiments of the invention, it is well recognized that in modern semiconductor design and fabrication, physical structures and circuits may be embodied in computer-readable descriptive form suitable for use in subsequent design, simulation, test or fabrication stages. Structures and functionality presented as discrete components in the exemplary configurations may be implemented as a combined structure or component. Various embodiments of the invention are contemplated to include circuits, systems of circuits, related methods, and tangible computer-readable medium having encodings thereon (e.g., VHSIC Hardware Description Language (VHDL), Verilog, GDSII data, Electronic Design Interchange Format (EDIF), and/or Gerber file) of such circuits, systems, and methods, all as described herein. In addition, the computer-readable media may store instructions as well as data that can be used to implement the invention. The instructions/data may be related to hardware, software, firmware or combinations thereof.

The description of the invention set forth herein is illustrative, and is not intended to limit the scope of the invention as set forth in the following claims. For example, while gate oxide breakdown detection circuits have been described in embodiments configuring an inverter in a delay line of a ring oscillator circuit, one of skill in the art will appreciate that the teachings herein can be utilized with other circuits as the device under test and other functional circuits that age the device under test. Variations and modifications of the embodiments disclosed herein, may be made based on the description set forth herein, without departing from the scope of the invention as set forth in the following claims.

What is claimed is:

1. An apparatus for detecting a breakdown of gate oxide of a transistor comprising:
    a first instance of a device responsive to a first node, the first instance of the device configured to be stressed in a first mode of the apparatus and to be unstressed in a second mode of the apparatus;
    a second instance of the device responsive to a second node;
    a power control circuit configured to couple a first high voltage reference input of the first instance of the device to a first power supply node in the first mode of the apparatus and to couple the first high voltage reference input of the first instance of the device to a second power supply node in the second mode of the apparatus;
    a precharge circuit configured to selectively precharge the first node and the second node in response to a precharge control signal in the second mode of the apparatus; and
    a voltage difference detection circuit configured to generate a gate oxide breakdown detection signal in response to a voltage difference across the first node and the second node in the second mode of the apparatus after precharging the first node and the second node.

2. The apparatus, as recited in claim 1, further comprising:
a test circuit configured to stress the first instance of the device in the first mode of the apparatus,
wherein the test circuit comprises a delay line including the first instance of the device and wherein in the first mode of the apparatus, the delay line is configured to continuously switch a first signal on the first node of the first instance of the device between a high signal level and a low signal level and to develop a drain current in at least one transistor under stress of the first instance of the device.

3. The apparatus, as recited in claim 2, wherein the delay line is configured as a ring oscillator.

4. The apparatus, as recited in claim 2, wherein the test circuit further comprises:
additional instances of the device coupled in parallel with the first instance of the device.

5. The apparatus, as recited in claim 1, wherein in the first mode of the apparatus, a second high voltage reference input of the second instance of the device is coupled to the second power supply node.

6. The apparatus, as recited in claim 1, wherein the first power supply node provides a first high reference voltage level greater than a manufacturer-specified upper voltage level limit and the second power supply node provides a ground reference voltage level.

7. The apparatus, as recited in claim 6, wherein the precharge circuit is coupled to a third power supply node configured to provide a second high reference voltage level, the second high reference voltage level being greater than the ground reference voltage level and less than or equal to the manufacturer-specified upper voltage level limit.

8. The apparatus, as recited in claim 1, wherein the first instance of the device and the second instance of the device are formed from regular devices and other devices of the apparatus are formed from high breakdown voltage devices.

9. The apparatus, as recited in claim 1, wherein the first instance of the device is a first inverter circuit comprising:
a p-type transistor having a first gate coupled to the first node, a first source terminal coupled to the power control circuit, and a first drain terminal; and
an n-type transistor having a second gate coupled to the first node, a second source terminal coupled to the second power supply node, and a second drain terminal coupled to the first drain terminal.

10. The apparatus, as recited in claim 1, wherein the precharge circuit comprises weak p-type keeper circuits, each weak p-type keeper circuit comprising a first p-type transistor coupled to the first instance of the device via a first resistor and a second p-type transistor coupled to the second instance of the device via a second resistor.

11. The apparatus, as recited in claim 1, further comprising:
a functional circuit configured to receive a first high reference voltage signal;
a voltage source configured to provide a predetermined voltage offset;
a circuit configured to provide a second high reference voltage signal to the first power supply node based on the first high reference voltage signal and the predetermined voltage offset; and
a monitor circuit comprising a test circuit configured to stress the first instance of the device in the first mode of the apparatus, the second instance of the device, the precharge circuit, the power control circuit, and the voltage difference detection circuit, the monitor circuit being configured to generate the gate oxide breakdown detection signal using the second high reference voltage signal, the first high reference voltage signal, and a low reference voltage signal.

12. The apparatus, as recited in claim 11, wherein the monitor circuit detects gate oxide breakdown of the first instance of the device prior to gate oxide breakdown of any device of the functional circuit.

13. A method for detecting breakdown of gate oxide of a transistor comprising:
applying electrical stress to a first instance of a device including at least one transistor coupled to a first node;
maintaining, in an unstressed state, a second instance of the device coupled to a second node;
removing the electrical stress from the first instance of the device;
precharging the first node and the second node after removing the electrical stress; and
after precharging the first node and the second node, generating a gate oxide breakdown detection signal based on a sensed voltage difference across the first node and the second node.

14. The method, as recited in claim 13, wherein the applying electrical stress comprises:
applying an oscillating signal to an input of the first instance of the device; and
applying a voltage level greater than a manufacturer-specified upper voltage level limit to a first power supply node of the first instance of the device, thereby developing a drain current in at least one transistor of the first instance of the device.

15. The method, as recited in claim 14, wherein the removing the electrical stress comprises:
disabling the oscillating signal at the input of the first instance of the device;
applying a ground voltage level to the first power supply node of the first instance of the device.

16. The method, as recited in claim 13, wherein the maintaining the second instance of the device in an unstressed state comprises applying a ground voltage level to a first power supply node of the second instance of the device and a second power supply node of the second instance of the device.

17. The method, as recited in claim 13, further comprising:
providing a first control signal to a power management circuit of an integrated circuit based on the gate oxide breakdown detection signal.

18. The method, as recited in claim 13, further comprising:
accelerating gate oxide breakdown of the first instance of the device as compared to gate oxide breakdown of another device in a functional circuit of an integrated circuit die,
wherein the breakdown is detected prior to a breakdown of gate oxide of a device of the functional circuit.

19. An apparatus comprising:
means for applying electrical stress to a first instance of a device including at least one transistor coupled to a first node, the electrical stress including overvoltage stress and functional operation of the device; and
means for sensing breakdown of gate oxide of the at least one transistor of the first instance of the device based on a first voltage on the first node and a second voltage on a second node coupled to a second instance of the device maintained in an electrically unstressed state.

20. The apparatus, as recited in claim 19, further comprising:

means for accelerating gate oxide breakdown of the at least one transistor as compared to gate oxide breakdown of other devices in a functional circuit of an integrated circuit die, wherein the breakdown occurs prior to breakdown of gate oxide in the other devices in the functional circuit.

* * * * *